(12) United States Patent
Choi et al.

(10) Patent No.: US 12,216,493 B2
(45) Date of Patent: Feb. 4, 2025

(54) ELECTRONIC DEVICE INCLUDING HINGE MODULE

(71) Applicant: SAMSUNG ELECTRONICS CO., LTD., Suwon-si (KR)

(72) Inventors: Myoungjun Choi, Suwon-si (KR); Haein Chung, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 149 days.

(21) Appl. No.: 18/175,537

(22) Filed: Feb. 28, 2023

(65) Prior Publication Data

US 2023/0236626 A1 Jul. 27, 2023

Related U.S. Application Data

(63) Continuation of application No. PCT/KR2023/001284, filed on Jan. 27, 2023.

(30) Foreign Application Priority Data

Jan. 27, 2022 (KR) .................. 10-2022-0012748

(51) Int. Cl.
*G06F 1/16* (2006.01)
*G06F 1/20* (2006.01)
(Continued)

(52) U.S. Cl.
CPC .......... *G06F 1/1616* (2013.01); *G06F 1/1681* (2013.01); *G06F 1/203* (2013.01);
(Continued)

(58) Field of Classification Search
CPC .... G06F 1/1616; G06F 1/1681; G06F 1/2023; G06F 1/16; G06F 1/20; G06F 1/1628; H05K 5/0226; H05K 5/03; H05K 7/20136

See application file for complete search history.

(56) References Cited

U.S. PATENT DOCUMENTS

| 8,014,147 B2 * | 9/2011 | Chen ..................... G06F 1/1684 |
| | | 200/61.7 |
| 8,520,382 B2 * | 8/2013 | Tye ........................ G06F 1/203 |
| | | 248/688 |

(Continued)

FOREIGN PATENT DOCUMENTS

| KR | 1020140105472 A | 9/2014 |
| KR | 101603110 B1 | 3/2016 |

OTHER PUBLICATIONS

International Search Report mailed Apr. 27, 2023 for PCT/KR2023/001284, citing the above reference(s).

*Primary Examiner* — Abhishek M Rathod
(74) *Attorney, Agent, or Firm* — CANTOR COLBURN LLP

(57) ABSTRACT

According to various embodiments of the disclosure, an electronic device may includes: a first housing in which a display module is disposed; a second housing in which a circuit board and a cooling fan connected to the circuit board are accommodated, where a first opening is defined in the second housing to introduce air into the cooling fan; and a hinge module rotatably connected to the first housing and the second housing, and disposed adjacent to the first opening. The hinge module may includes: a hinge housing in which a first hinge opening is defined to be connected to the first opening; a first main gear disposed in the hinge housing and operably connected to the first housing; a second main gear operably connected to the second housing and configured to rotate in correspondence with the first main gear; a driving gear disposed adjacent to at least one of the first main gear or the second main gear and rotatable in correspondence with at least one of the first main gear or the second main gear; and a first cover plate disposed in the hinge housing and including a first rack gear area which meshes with the driving gear. The electronic device may be (Continued)

switchable between a closed state in which an angle formed by the first housing and the second housing is less than a predetermined angle and an open state in which the angle formed by the first housing and the second housing is equal to or greater than the predetermined angle. When the electronic device is in the closed state, the first cover plate is disposed to overlap with at least part of the first hinge opening. When the electronic device is in the open state, the first cover plate may be spaced apart from the first hinge opening, and the first hinge opening may be opened.

20 Claims, 12 Drawing Sheets

(51) Int. Cl.
*H05K 5/02* (2006.01)
*H05K 5/03* (2006.01)
*H05K 7/20* (2006.01)

(52) U.S. Cl.
CPC ............. *H05K 5/0226* (2013.01); *H05K 5/03* (2013.01); *H05K 7/20136* (2013.01)

(56) References Cited

U.S. PATENT DOCUMENTS

| | | | |
|---|---|---|---|
| 9,277,660 B1 * | 3/2016 | McBroom | H05K 5/0004 |
| 9,575,524 B1 * | 2/2017 | Prather | G06F 1/1662 |
| 9,740,253 B2 * | 8/2017 | Cheng | G06F 1/1681 |
| 9,965,006 B2 * | 5/2018 | Peng | G06F 1/1616 |
| 10,241,547 B2 | 3/2019 | Hsu | |
| 10,289,176 B1 * | 5/2019 | Chen | G06F 1/206 |
| 10,582,638 B2 * | 3/2020 | Ye | G06F 1/1681 |
| 11,016,528 B2 * | 5/2021 | Lin | G06F 1/1616 |
| 11,054,872 B2 * | 7/2021 | Wu | G06F 1/1681 |
| 11,132,026 B2 * | 9/2021 | Yang | G06F 1/1647 |
| 11,163,344 B2 * | 11/2021 | Huang | G06F 1/1681 |
| 11,262,822 B1 * | 3/2022 | North | H05K 7/20409 |
| 11,269,383 B2 * | 3/2022 | Huang | G06F 1/1616 |
| 11,320,876 B1 * | 5/2022 | North | G06F 1/166 |
| 11,460,897 B2 * | 10/2022 | Kulkarni | H05K 7/20972 |
| 11,797,058 B2 * | 10/2023 | Lin | G06F 1/166 |
| 2010/0165567 A1 * | 7/2010 | Shih | G06F 1/1667 361/679.48 |
| 2011/0013372 A1 | 1/2011 | Kang | |
| 2012/0113593 A1 * | 5/2012 | Hsu | G06F 1/203 361/696 |
| 2012/0127652 A1 * | 5/2012 | Lin | G06F 1/203 361/688 |
| 2013/0107465 A1 * | 5/2013 | Huang | G06F 1/1675 361/725 |
| 2013/0208436 A1 * | 8/2013 | Hu | G06F 1/1616 361/807 |
| 2013/0225001 A1 * | 8/2013 | Chang | G06F 1/166 439/625 |
| 2013/0308268 A1 * | 11/2013 | Tani | G06F 1/1679 361/679.02 |
| 2015/0169014 A1 | 6/2015 | Rivera et al. | |
| 2017/0010637 A1 | 1/2017 | Garelli et al. | |
| 2017/0060201 A1 | 3/2017 | Prather et al. | |
| 2017/0153677 A1 | 6/2017 | Cheng et al. | |
| 2019/0317552 A1 | 10/2019 | Cheng et al. | |
| 2020/0012323 A1 * | 1/2020 | Huang | F16C 11/04 |
| 2020/0117245 A1 | 4/2020 | Ou et al. | |
| 2020/0142456 A1 * | 5/2020 | Hsu | G06F 1/203 |
| 2020/0187381 A1 | 6/2020 | Degner et al. | |
| 2021/0089077 A1 * | 3/2021 | Wang | G06F 1/3287 |
| 2021/0096618 A1 * | 4/2021 | Radhakrishnan | G06F 1/206 |

* cited by examiner

ELECTRONIC DEVICE INCLUDING HINGE MODULE

CROSS-REFERENCE TO RELATED APPLICATIONS

This application is a continuation of International Application No. PCT/KR2023/001284, filed Jan. 27, 2023, designating the United States, in the Korean Intellectual Property Receiving Office, and claiming priority to KR Patent Application No. 10-2022-0012748, filed Jan. 27, 2022, the disclosures of which are all hereby incorporated by reference herein in their entireties.

BACKGROUND

1. Field

Various embodiments of the disclosure relate to an electronic device including a hinge module.

2. Description of Related Art

Various types of electronic devices are widely used in various fields according to recent development of information and communication technology and semiconductor technology.

An electronic device refers to a device that performs a specified function according to a loaded program, such as a home appliance, an electronic notebook, a portable multimedia player, a mobile communication terminal, a tablet personal computer (PC), a video/audio device, a desktop/laptop computer, and/or an in-vehicle navigation device. For example, the electronic device may output stored information as sound or an image. As the integration level of electronic devices increases, and high-speed and large-capacity wireless communication becomes common, a single small-sized electronic device such as a mobile communication terminal may be equipped with various functions. For example, an entertainment function such as games, a multimedia function such as music/video playback, a communication and security function for mobile banking, scheduling, and an electronic wallet function as well as a communication function is integrated into one electronic device. Such electronic devices become smaller to improve portability and aesthetic appeal thereof.

SUMMARY

An electronic device (e.g., a laptop computer) may provide information to a user by using a display in an unfolded state, and may be closed to increase portability when not used.

The electronic device may include a housing forming its exterior and an opening formed in the housing, for air flow into the electronic device. When the opening is formed in the housing and exposed to the outside regardless of whether the electronic device is used, a foreign material may be introduced into the electronic device and impair the aesthetics of the exterior of the electronic device.

According to various embodiments of the disclosure, provided is an electronic device including a hinge module variable in shape according to a manner in which the electronic device is used.

Objects to be achieved in the disclosure are not limited to what is described above, and may be extended in various manners without departing from the scope and spirit of the disclosure.

According to various embodiments of the disclosure, an electronic device may includes: a first housing in which a display module is disposed; a second housing in which a circuit board and a cooling fan connected to the circuit board are accommodated, where a first opening is defined in the second housing to introduce air into the cooling fan; and a hinge module rotatably connected to the first housing and the second housing, and disposed adjacent to the first opening. The hinge module may includes: a hinge housing in which a first hinge opening is defined to be connected to the first opening; a first main gear disposed in the hinge housing and operably connected to the first housing; a second main gear operably connected to the second housing and configured to rotate in correspondence with the first main gear; a driving gear disposed adjacent to at least one of the first main gear or the second main gear and rotatable in correspondence with at least one of the first main gear or the second main gear; and a first cover plate disposed in the hinge housing and including a first rack gear area which meshes with the driving gear. The electronic device may be switchable between a closed state in which an angle formed by the first housing and the second housing is less than a predetermined angle and an open state in which the angle formed by the first housing and the second housing is equal to or greater than the predetermined angle. When the electronic device is in the closed state, the first cover plate is disposed to overlap with at least part of the first hinge opening. When the electronic device is in the open state, the first cover plate may be spaced apart from the first hinge opening, and the first hinge opening may be opened.

According to various embodiments of the disclosure, a hinge module for rotatably connecting a first housing and a second housing to each other includes: a hinge housing in which a first hinge opening is defined to be connected to a first opening defined in the first housing or the second housing; a first connection unit including a first connection shaft, a first main gear connected to the first connection shaft, and a first connection member connected to the first connection shaft and the first housing; a second connection unit including a second connection shaft, a second main gear connected to the second connection shaft, a second connection member connected to the second connection shaft and the second housing, and a transmission gear connected to the second connection shaft and disposed adjacent to the second main gear; a driving gear which operates by receiving a force from the transmission gear; and a cover plate including a rack gear area which meshes with the driving gear in at least part thereof. When at least one of the first housing or the second housing rotates, the cover plate may operate to be spaced from the first hinge opening.

An electronic device according to various embodiments includes a hinge module including an opening which may be closed or opened according to states or positions of the electronic device. Therefore, the aesthetic appeal of the electronic device may be improved, and the introduction of a foreign material into the electronic device may be reduced when the electronic device is used.

DETAILED DESCRIPTION

Figure 1:
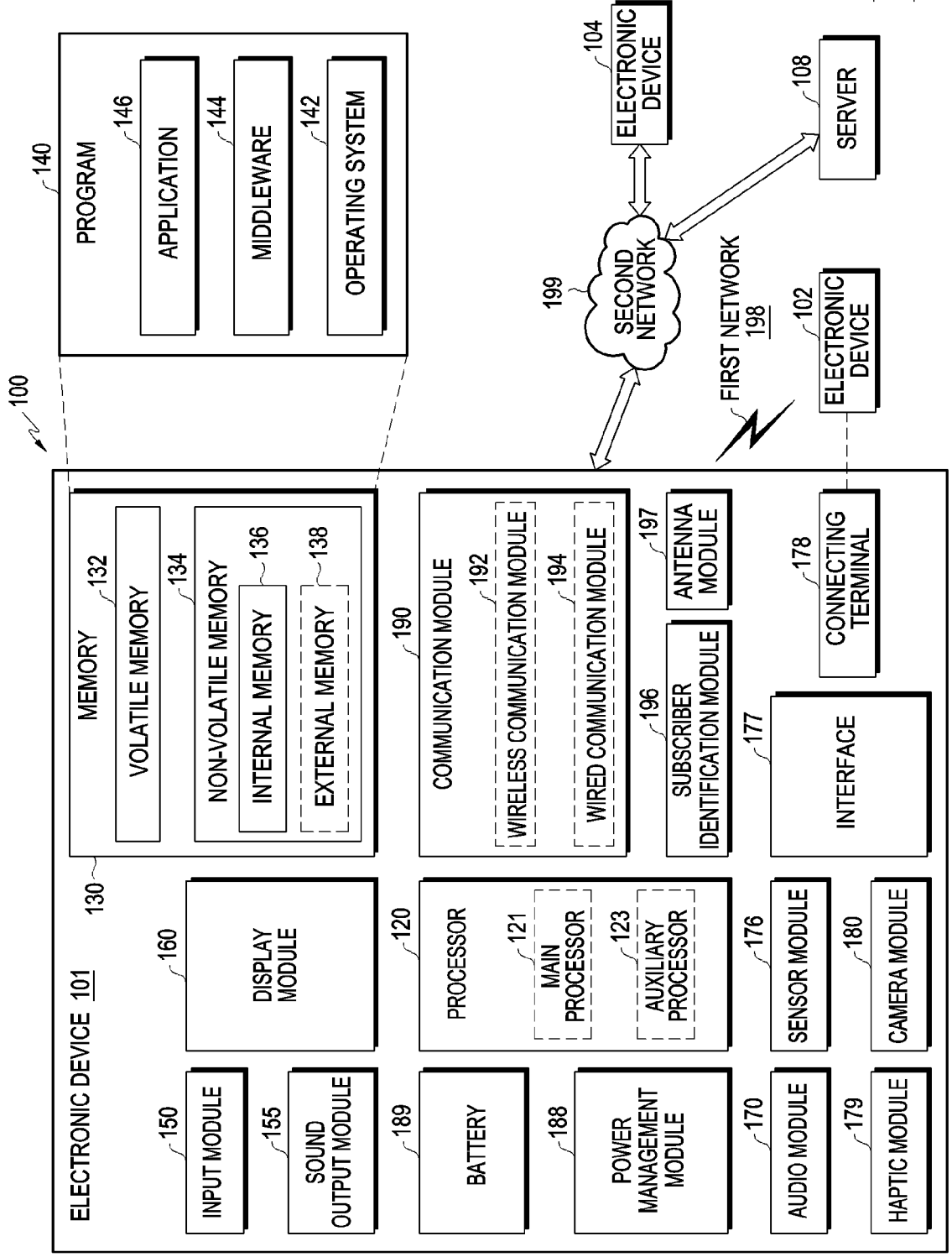
FIG. 1 is a block diagram illustrating an electronic device in a network environment according to various embodiments of the disclosure.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160). The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
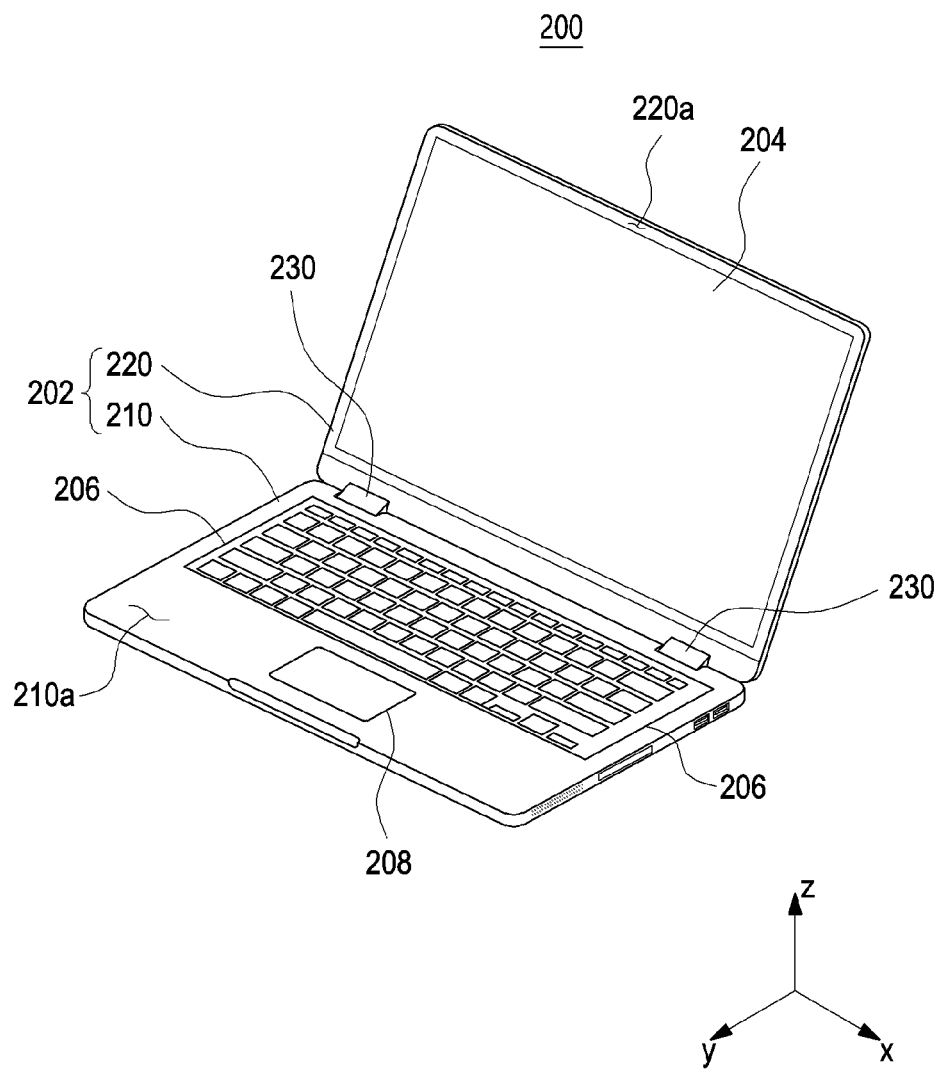
FIG. 2 is a perspective view illustrating an electronic device in a first state according to various embodiments of the disclosure.
Figure 3:
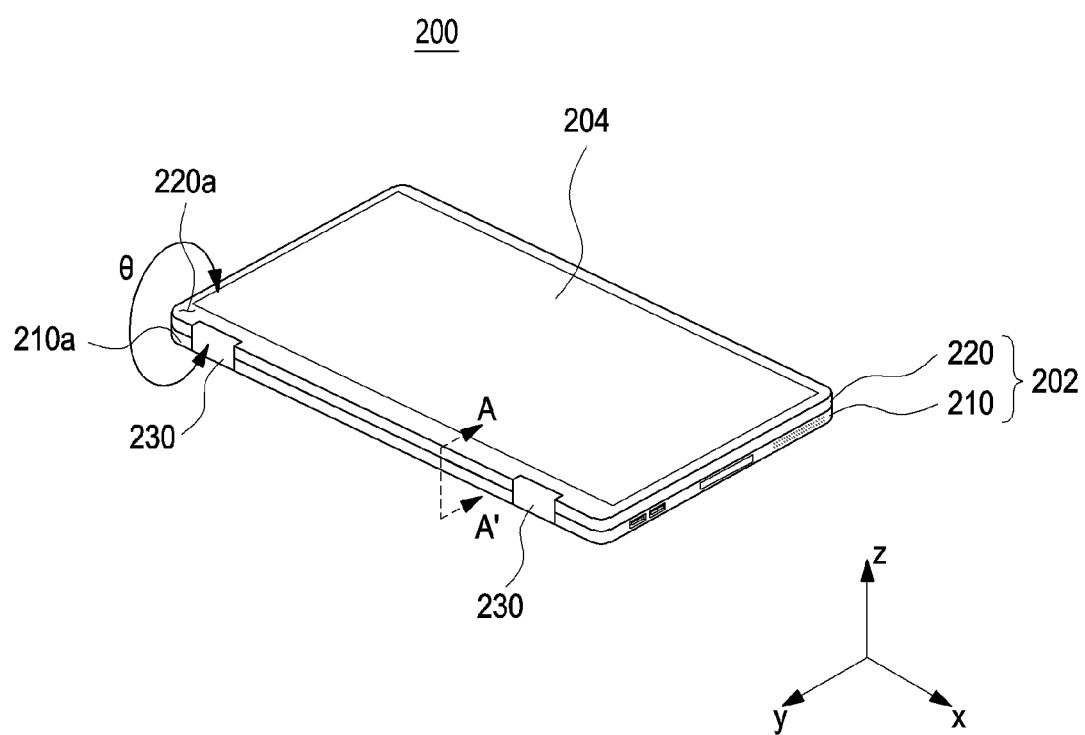
FIG. 3 is a perspective view illustrating an electronic device in a second state according to various embodiments of the disclosure.

FIG. 2 is a perspective view illustrating an electronic device in a first state according to various embodiments of the disclosure. FIG. 3 is a perspective view illustrating the electronic device in a second state according to various embodiments of the disclosure.

Referring to FIGS. 2 and 3, an embodiment of an electronic device 200 may include a housing 202 and a display 204. According to an embodiment, the electronic device 200 may be a laptop computer, a notebook computer, or a portable terminal. The configuration of the electronic device 200 of FIG. 2 may be the same in whole or part as that of the electronic device 101 of FIG. 1.

According to various embodiments, the housing 202 may form at least part of the exterior of the electronic device 200 or support a component (e.g., the display 204) of the electronic device 200. For example, the housing 202 may accommodate at least one of the display 204, an input device 206, or a touchpad 208.

According to various embodiments, the electronic device 200 may be open or closed. For example, the housing 202 may include a first housing 210 and a second housing 220 configured to be rotatable with respect to the first housing 210. According to an embodiment, the electronic device 200 may include at least one hinge module 230 connected to the first housing 210 and the second housing 220.

According to various embodiments, the first housing 210 may be configured to rotate in a predetermined angle range (e.g., in a range of about 0 degrees to about 360 degrees) with respect to the second housing 220, using the hinge module 230. For example, the electronic device 200 may operate in the first state (e.g., FIG. 2) (a clamshell mode). In the first state, the angle θ between a first front surface 210a of the first housing 210 and a second front surface 220a of the second housing 220 may be in a range of about 90 degrees to about 130 degrees. As an example, the electronic device 200 may operate in the second state (e.g., FIG. 3) (a tablet mode). In the second state, the angle θ between the first housing 210 and the second housing 220 may be about 360 degrees. According to an embodiment, rotation of the first housing 210 with respect to the second housing 220 may be interpreted as rotation of the second housing 220 with respect to the first housing 210.

According to various embodiments, the housing 202 may include or be formed of a metal material or a non-metal material having a selected rigidity. According to an embodiment, at least part of the electronic device 200 formed of the metal material may provide a ground plane and may be electrically connected to a ground line formed on a printed circuit board (not shown). For example, the housing 202 may be electrically connected to the printed circuit board via a capacitive component.

According to various embodiments, the display 204 may be a flexible display with at least a partial area deformable into a flat and/or curved surface. For example, the display 204 may be a foldable or rollable display. The configuration of the display 204 may be the same in whole or part as that of the display module 160 of FIG. 1. According to an embodiment, at least part of the display 204 may be disposed within the second housing 220. According to an embodiment, at least part of the display 204 may be visually exposed to the outside of the electronic device 200.

According to various embodiments, the display 204 may be coupled with or disposed adjacent to a touch sensing circuit, a pressure sensor capable of measuring the intensity (pressure) of a touch, and/or a digitizer configured to detect a magnetic field-type stylus pen.

According to various embodiments, the electronic device 200 may include the input device 206 capable of sensing a user input (e.g., pressure). According to an embodiment, the input device 206 may be disposed on the first housing 210. According to an embodiment, in the first or closed state of the electronic device 200, at least part of the input device 206 may face at least part of the display 204. The configuration of the input device 206 of FIG. 2 may be the same in whole or part as that of the input module 150 of FIG. 1. For example, the input device 206 may be a keyboard.

According to various embodiments, the electronic device 200 may include the touchpad 208 configured to sense or receive a user input. According to an embodiment, the touchpad 208 may include a capacitive touch sensor, a touch sensor based on resistive sensing, an optical touch sensor, or a surface acoustic wave touch sensor. For example, the touchpad 208 may sense current, pressure, light, and/or vibration caused by an input applied to the touchpad 208 by a user, and the processor (e.g., the processor 120 of FIG. 1) and/or the touchpad 208 may determine the user input based on a change in the sensed current, pressure, light, and/or vibration.

According to various embodiments, the processor 120 and/or the touchpad 208 may determine the position (e.g., XY coordinates) of the user input. According to an embodiment, the touchpad 208 may sense pressure on the touchpad 208. For example, the touchpad 208 may sense a force in a thickness direction (e.g., Z-axis direction), using a switch member (not shown) and at least one force sensor (not shown). According to an embodiment, when an external object (e.g., a user's finger or a stylus pen) comes in direct contact with or is located in proximity to a surface of the touchpad 208, the touchpad 208 may detect the external object.

According to various embodiments, the touchpad 208 may be accommodated in the housing 202. For example, the touchpad 208 may be connected to the first housing 210, and at least part thereof may be exposed to the outside of the first housing 210. According to an embodiment, the touchpad 208 may be adjacent to the input device 206. According to an embodiment, at least part of the touchpad 208 may face the display 204 in the closed state of the electronic device 200. The configuration of the touchpad 208 may be the same in whole or in part as that of the input module 150 of FIG. 1.

Figure 4A:
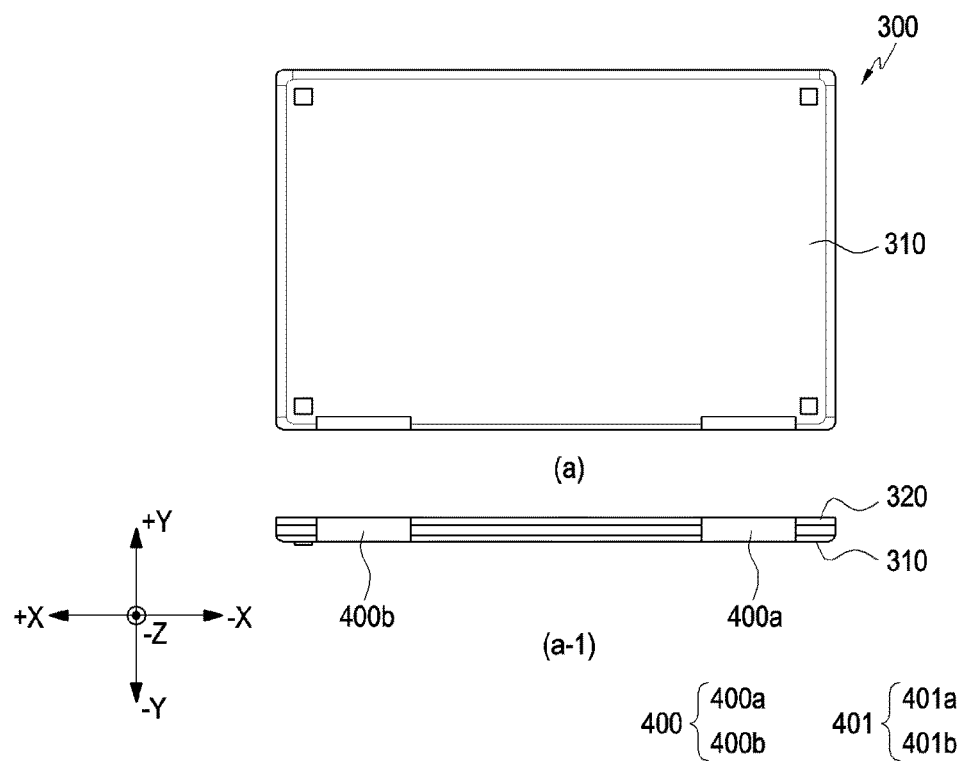
FIGS. 4A and 4B are diagrams illustrating an electronic device in an open state and a closed state according to various embodiments.
Figure 4B:
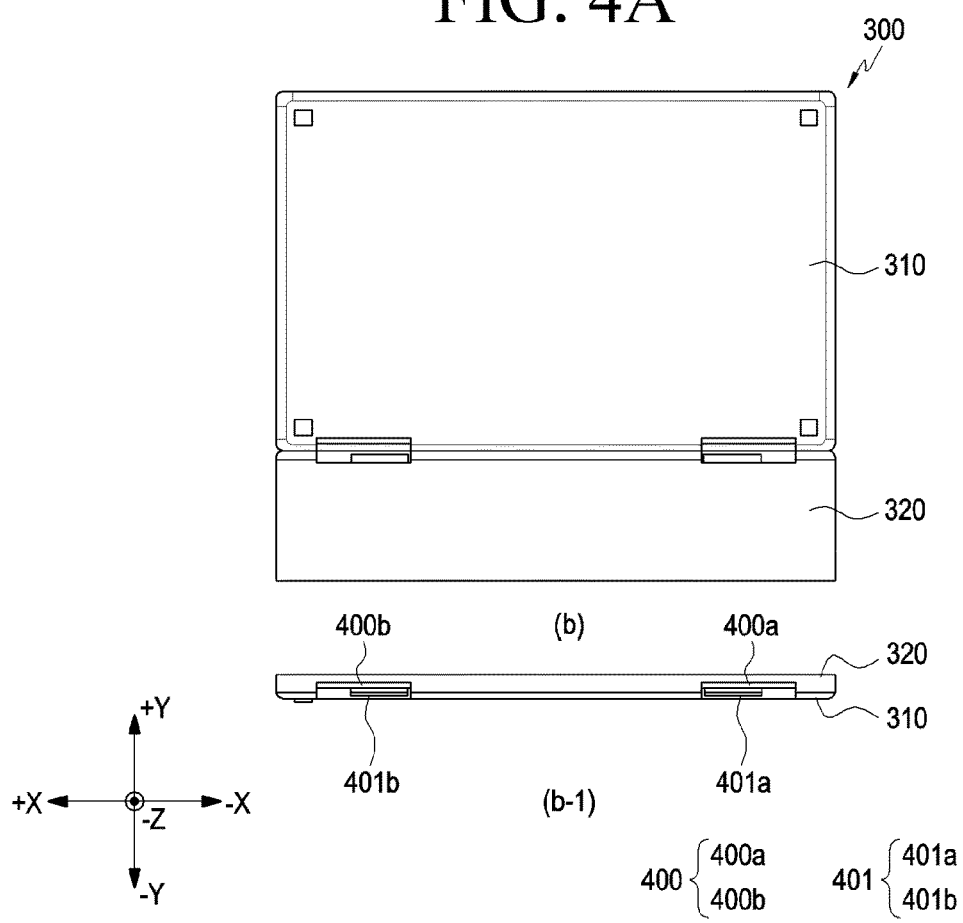
Figure 5A:
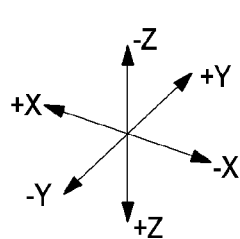
FIGS. 5A and 5B are diagrams illustrating operations of an electronic device and a hinge module according to various embodiments.
Figure 5A:
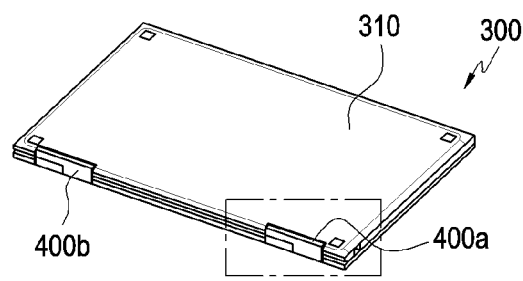
Figure 5B:
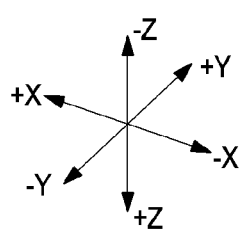
Figure 5B:
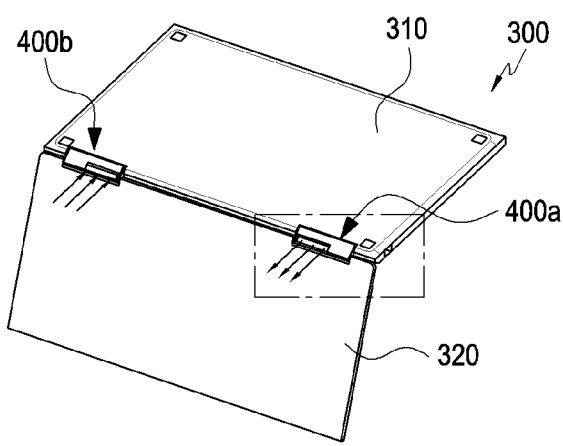
Figure 5C:
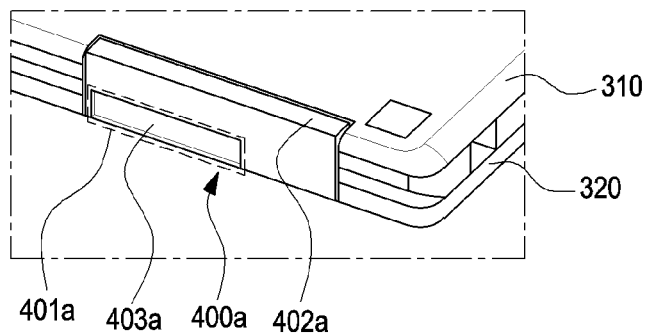
FIGS. 5C and 5D are enlarged views of the encircled portions of FIGS. 5A and 5B, respectively.
Figure 5D:
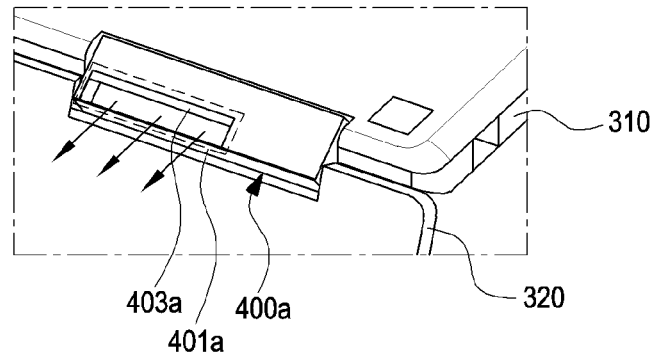

FIGS. 4A and 4B are diagrams illustrating an electronic device in an open state and a closed state according to various embodiments. FIGS. 5A and 5B are diagrams illustrating operations of an electronic device and a hinge module according to various embodiments. FIGS. 5C and 5D are enlarged views of the encircled portions of FIGS. 5A and 5B, respectively.

Referring to FIGS. 4A to 5D, an embodiment of an electronic device 300 may include a first housing 310, a second housing 320, and a hinge module 400. For a description of various components (e.g., the first housing 310, the second housing 320, and/or the hinge module 400) of the electronic device 300 illustrated in FIG. 4 may be substantially the same as the corresponding components (e.g., the first housing 210, the second housing 220, and/or the hinge module 230) of the electronic device illustrated in FIGS. 2 and 3, and any repetitive detailed description thereof may be omitted or simplified.

According to various embodiments, the electronic device 300 may operate to switch from the closed state (e.g., FIG. 4A) to the open state (e.g., the clamshell mode of FIG. 2). For example, the closed state may refer to a state in which the second housing 320 covers the top (e.g., the input device 206 of FIG. 2) of the first housing 310. In an example, where the electronic device 300 is a laptop computer, the closed state may mean that the laptop computer is closed. In addition, the open state may refer to a state in which the second housing 320 is rotated at a predetermined angle with respect to the first housing 310 so that the electronic device 300 may be used, when the electronic device 300 is a laptop computer.

According to various embodiments, the hinge module 400 may rotatably connect the first housing 310 and the second housing 320 to each other. As described later, at least a part of the hinge module 400 (e.g., a first connection member 519 of FIG. 7) may be connected to the first housing 310, and another part (e.g., a second connection member 529 of FIG. 7) thereof may be connected to the second housing 320.

According to various embodiments, the hinge module 400 may be in a first state in which a vent hole 401 is shielded or covered and a second state in which the vent hole 401 is opened. For example, in response to the electronic device 300 being switched from the closed state to the open state, the hinge module 400 may be switched from the first state of the vent hole 401 to the second state of the vent hole 401. For example, the vent hole 401 of the hinge module 400 may be closed in the first state, thereby preventing the introduction of a foreign material into the electronic device 300, and improving aesthetic appeal by forming a smoothly connected exterior. In an example, the second state may refer to a state in which at least part of the hinge module 400 is opened, when the electronic device 300 is in the open state. For example, in the second state, an opening (e.g., the vent hole 401) may be formed in at least part of the hinge module 400, and a passage (e.g., the vent hole 401) for communicating air with the inside of the electronic device 300 may be provided. For example, the vent hole 401 may be provided as the opening in the at least part of the hinge module 400.

According to various embodiments, the hinge module 400 may include a first hinge module 400a and a second hinge module 400b. In the following description of the disclosure, the first hinge module 400a and the second hinge module 400b may be symmetrical to each other or have a same configuration as each other. Accordingly, it would be understood that the description of the first hinge module 400a may be equally applied to the second hinge module 400b, unless otherwise specified.

According to various embodiments, the first hinge module 400a and the second hinge module 400b may be disposed symmetrically in a longitudinal direction (X-axis direction) of the electronic device 300. For example, the first hinge module 400a may be disposed on a side (+X-axis direction) of the electronic device 300, and the second hinge module 400b may be disposed on the other side (−X-axis direction) opposing the side of the electronic device 300. Thus, the second housing 320 may be stably supported to rotate with respect to the first housing 310. In an embodiment, the afore-mentioned vent hole 401 may include a first vent hole 401a formed in the first hinge module 400a and a second vent hole 401b formed in the second hinge module 400b. In an embodiment, when at least one vent hole 401a and/or 401b is provided as an inlet for introducing air into the electronic device 300, the other vent hole 401a and/or 401b may be provided as an outlet for discharging air from the inside of the electronic device 300. As an example, each of the first and second vent holes 401a and 401b may function as both an inlet and an outlet. In this context, it may be said that the hinge module 400 according to various embodiments provides a vent structure through which air may be delivered to the inside and outside of the electronic device 300.

For example, the electronic device 300 may include a circuit board (not shown) and a cooling device (e.g., a cooling fan) that operates in connection to the circuit board. The circuit board may be disposed in the first housing 310 or the second housing 320. The cooling device may receive air from the outside of the electronic device 300 and transfer heated air inside the electronic device 300 to the outside to lower the internal temperature of the electronic device 300. As described above, the hinge module 400 according to various embodiments may provide a passage through which air may communicate between the cooling device disposed inside the electronic device 300 and the outside of the electronic device 300.

According to various embodiments, as shown in FIGS. 5A to 5D, the first hinge module 400a may include a first hinge housing 402a and a first cover 403a disposed adjacent to the first hinge housing 402a. When the first hinge module 400a is in the first state, the first cover 403a may shield the first vent hole 401a. When the electronic device 300 is switched from the closed state to the open state, the first cover 403a may be spaced apart from at least part of the first hinge housing 402a to form the first vent hole 401a, and the hinge module 400a may be switched to the second state. As an example, it may be said that the first cover 403a shields the first vent hole 401a in the first state and opens the first vent hole 401a in the second state.

In the following description of the disclosure, the vent structure applied to the hinge module 400 will be described in greater detail with reference to the drawings.

Figure 6:
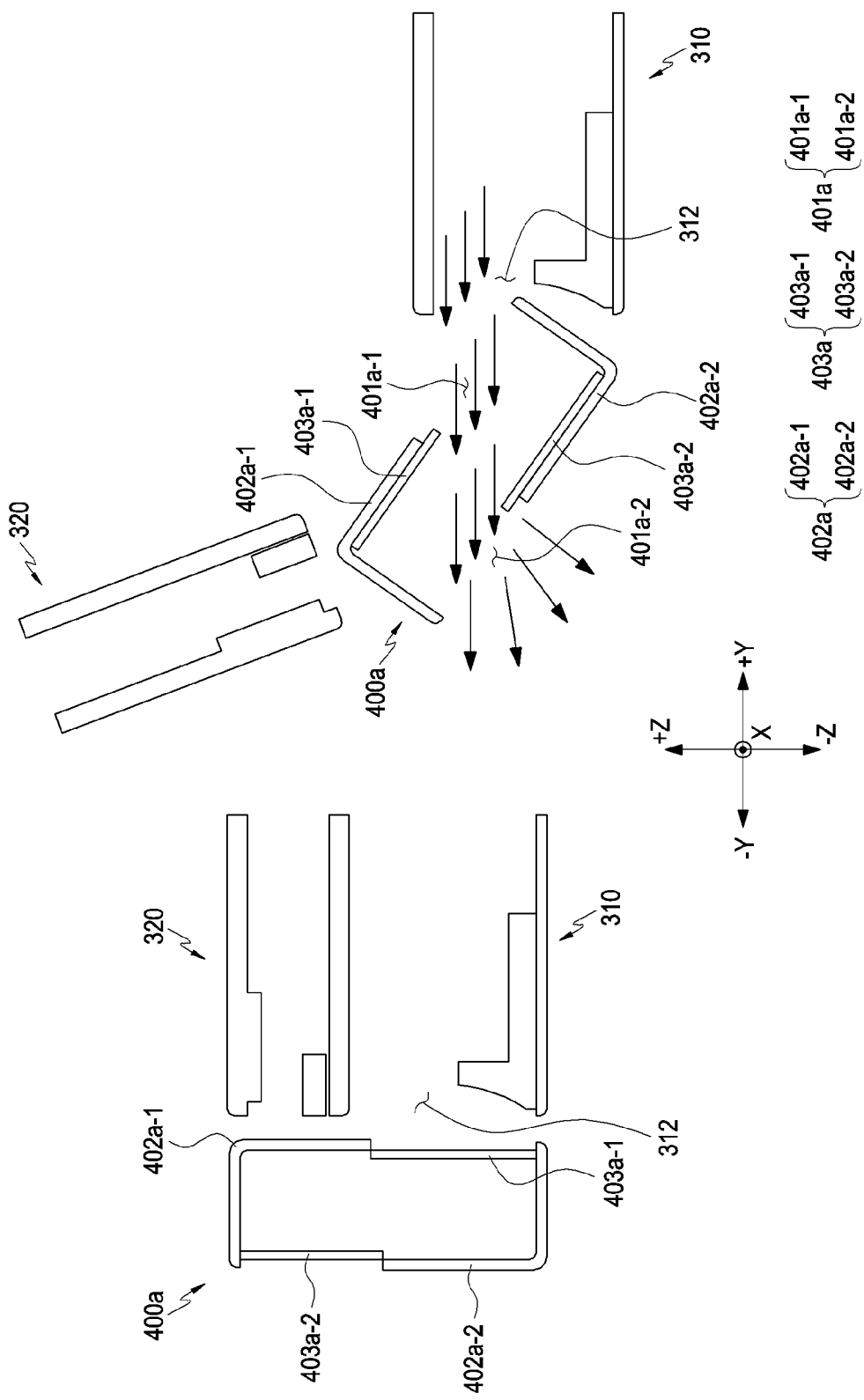
FIG. 6 is a diagram illustrating an operation of the hinge module of FIGS. 5A to 5D in a side cross-section of the electronic device.

FIG. 6 is a diagram illustrating the operation of the hinge module of FIGS. 5A to 5D in a side cross-section of the electronic device.

Referring to FIG. 6, in an embodiment, the first hinge module 400a may include a first support portion 402a-1, a first cover plate 403a-1 disposed adjacent to the first support portion 402a-1, a second support portion 402a-2, and a second cover plate 403a-2 disposed adjacent to the second support portion 402a-2. The first hinge module 400a may be substantially the same as the hinge module 400 described above with reference to FIG. 4, and any repetitive detailed description thereof will be omitted. For example, the description of the first cover 403a of FIG. 4 may be adaptively applied to the first cover plate 403a-1 and/or the second cover plate 403a-3, and the description of the first hinge housing 402a of FIG. 4 may be adaptively applied to the first support portion 402a-1 and the second support portion 402a-2.

According to various embodiments, the first hinge housing 402a may include the first support portion 402a-1 and the second support portion 402a-2. In an embodiment, the first support portion 402a-1 and the second support portion 402a-2 may be symmetrically disposed. For example, the first support portion 402a-1 may be disposed on a first side (−Y-axis direction) of the first hinge housing 402a, and the second support portion 402a-2 may be disposed on a second side (+Y-axis direction) of on the first hinge housing 402a. As an example, the second support portion 402a-2 may be disposed adjacent to the first housing 310 and the second housing 320, and may be disposed to face the first housing 310 and the second housing 320, with the first support portion 402a-1 interposed therebetween.

According to various embodiments, the first hinge housing 402a may include a cover plate 403a. The cover plate 403a may include the first cover plate 403a-1 and the second cover plate 403a-2. The cover plate 403a may have a same configuration in whole or part as the first cover 403a described above with reference to FIGS. 4A to 5D. The first hinge housing 402a may include the first vent hole 401a, that is, the first vent hole 401a is defined in the first hinge housing 402a. The first vent hole 401a may correspond to the first vent hole 401a described above with reference to FIGS. 4A to 5D. In an embodiment, the first vent hole 401a is formed in the hinge module (e.g., the first hinge module 400a), and thus may be referred to as a hinge opening. In the disclosure, the terms, the first vent hole 401a and the hinge opening 401a may be used interchangeably. In an embodiment, the first vent hole 401a may include a first hinge opening 401a-1 formed in the first support portion 402a-1 and a second hinge opening 401a-2 formed in the second support portion 402a-2.

In an embodiment, the first support portion 402a-1 may be operatively connected to the first cover plate 403a-1. As described above, when the hinge module 400 is switched from the first state to the second state, the first cover plate 403a-1 may move along at least part of an inner surface 404a-1 (not shown) of the first support portion 402a-1, and thus the first hinge opening 401a-1 may be opened. In the following description, the description of the first support portion 402a-1 and the first cover plate 403a-1 may be applied equally or similarly to the second support portion 402a-2 and the second cover plate 403a, unless otherwise specified.

For example, when the hinge module 400 is switched from the first state to the second state, the second cover plate 403a-2 may move along an inner surface (not shown) of the second support portion 402a-2, and thus the second hinge opening 401a-2 may be opened. As an example, it may be said that the first cover plate 403a-1 shields the first hinge opening 401a-1 formed in the first support portion 402a-1 in the first state of the hinge module 400, and is spaced apart from the first hinge opening 401a-1 in the second state of the hinge module 400. Similarly, in the second state of the hinge module 400, the second hinge opening 401a-2 may also be opened.

According to various embodiments, air may travel from the inside of the electronic device (e.g., the electronic device 300 of FIG. 4) to the outside of the electronic device (or vice versa) through the hinge opening 401a opened as the hinge module 400 is switched from the first state to the second state. In an embodiment, the first housing 310 may include a first opening 312. For example, as described above, the first and second hinge openings 401a-1 and 401a-2 may be connected to the first opening 312, thereby providing a passage through which air may flow from the inside of the first housing 310 to the outside of the first housing 310 (or vice versa).

When the hinge module 400 according to various embodiments is in the first state, an opening (e.g., the second vent hole 401b) is not visible on a side surface of the electronic device (e.g., the electronic device 300 of FIG. 4) due to a cover plate (e.g., the second cover plate 403a-2), and thus may improve aesthetic appeal of the electronic device. In addition, when the hinge module 400 is in the second state, the vent hole (e.g., the first and second hinge openings 401a-1 and 401a-2) may be connected to the first opening 312 to provide a passage through which air may move from the inside of the electronic device and thus increase heat dissipation performance of the electronic device.

Figure 7:
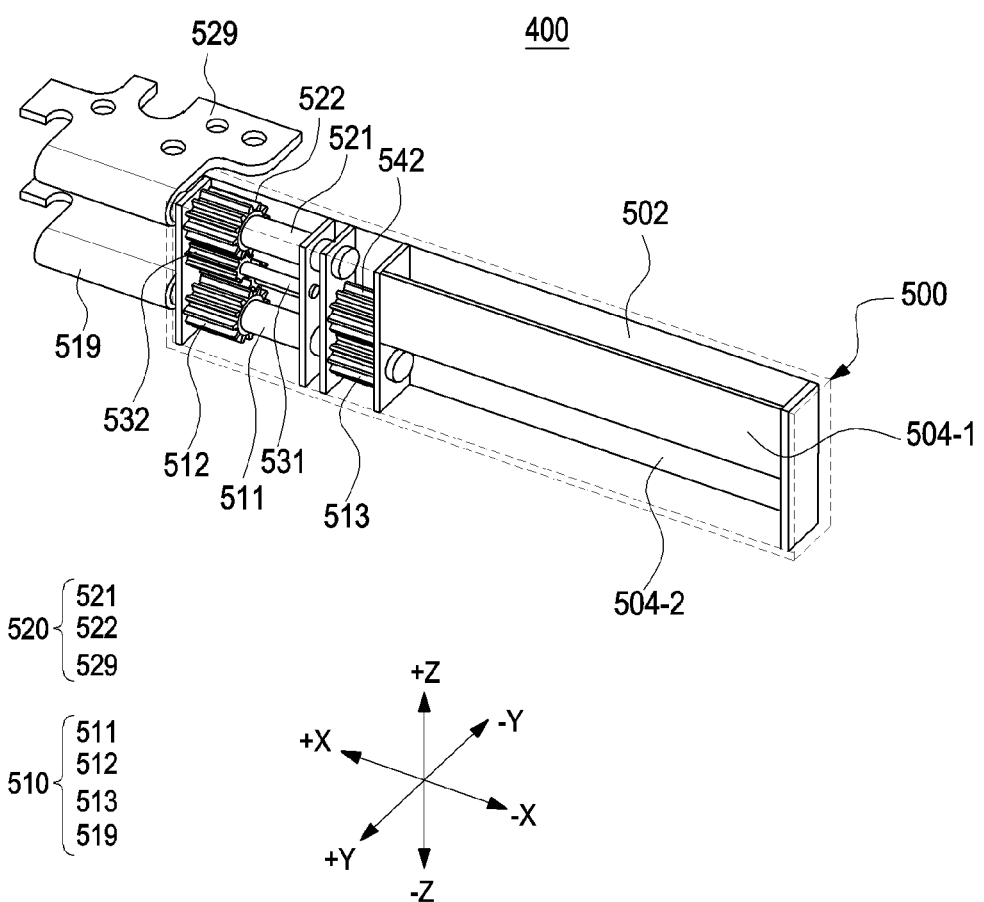
FIG. 7 is a diagram illustrating a force structure of the hinge module of FIGS. 5A to 5D.
Figure 8A:
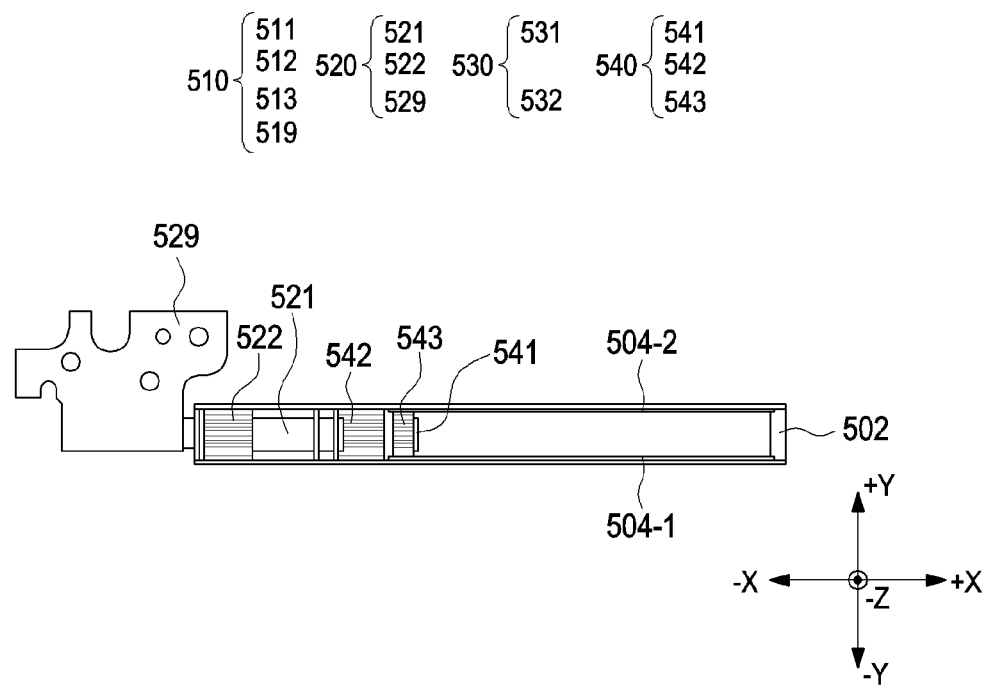
FIGS. 8A and 8B are top and front views illustrating the force structure of FIG. 7.
Figure 8B:
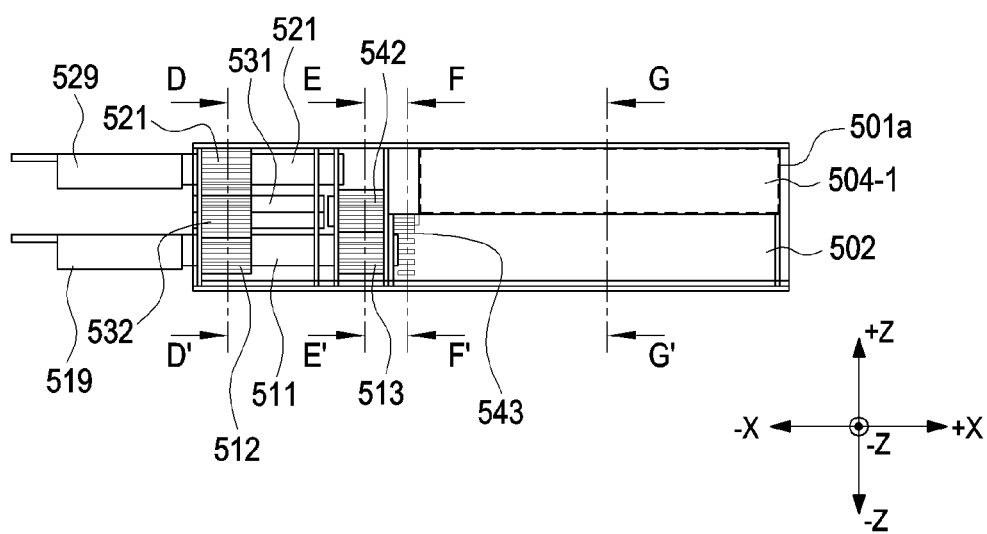
Figure 9:
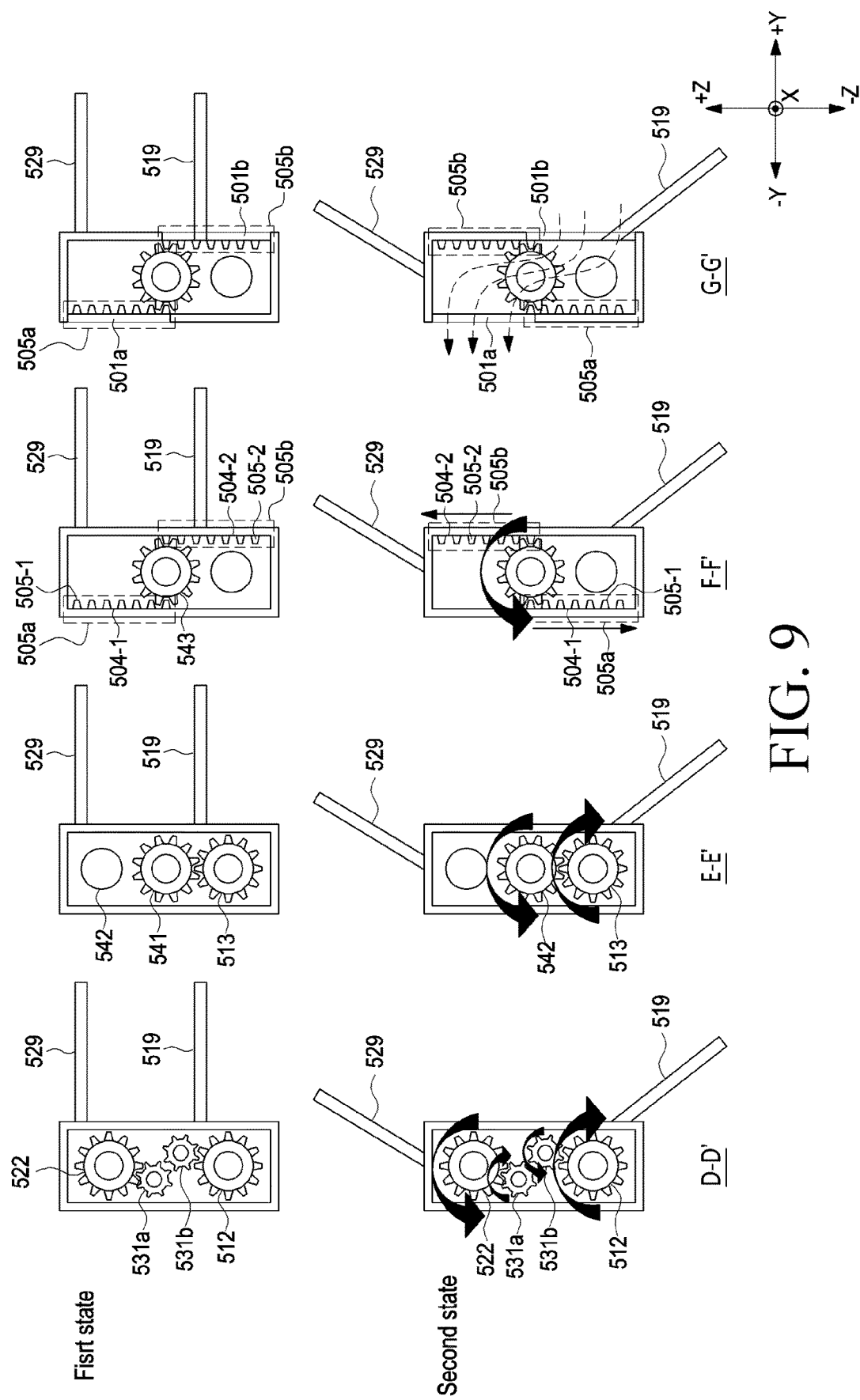
FIG. 9 is a diagram illustrating cross-sections of the force structure of FIGS. 8A and 8B according to various embodiments.

FIG. 7 is a diagram illustrating a force structure of the hinge module of FIGS. 5A to 5D according to various embodiments. FIGS. 8A and 8B are top and front views illustrating the force structure of FIG. 7. Particularly, FIG. 8A is a top view illustrating the force structure, and FIG. 8B is a front view illustrating the force structure. FIG. 9 is a diagram illustrating cross-sections of the force structure illustrated in FIGS. 8A and 8B according to various embodiments.

Referring to FIGS. 7 to 9, an embodiment of a hinge module (e.g., the hinge module 400 of FIGS. 4 to 6) may include a force structure 500 for driving. In various embodiments, the force structure 500 may include all or some of a first connection unit 510, a second connection unit 520, an auxiliary unit 530, and/or a driver 540. For the force structure 500 of FIGS. 7 to 9, the description of the hinge module 400 or the first and second hinge modules 400a and 400b described before with reference to FIGS. 4 to 6 may be applied adaptively.

According to various embodiments, the first connection unit 510 may include the first connection member 519 connected to a first housing (e.g., the first housing 310 of FIG. 6), a first connection shaft 511, and a first main gear 512 and a transmission gear 513 which are disposed around the first connection shaft 511. The first connection member 519 may be connected to the first housing (e.g., the first housing 310 of FIG. 6) and transmit a force corresponding to rotation of the first housing 310 to the first connection unit 510. Alternatively, as described later, the first main gear 512 may receive a force from a second main gear 522 directly or via an auxiliary gear 532. In an embodiment, the transmission gear 513 may transmit the force of the first main gear 512 to the driver 540. The driver 540 may receive the force to operate a cover plate 504, which will be described later. In an embodiment, one or more auxiliary unit 530 may be provided. For example, the auxiliary unit 530 may include an auxiliary shaft 531 and the auxiliary gear 532 disposed on one side of the auxiliary shaft 531. The auxiliary gear 532 may be connected between the first main gear 512 and the second main gear 522.

According to various embodiments, the second connection unit 520 may include the second connection member 529 connected to a second housing (e.g., the second housing 320 of FIG. 6), a second connection shaft 521, and the second main gear 522 disposed around the second connection shaft 521. The second connection member 529 may be connected to the second housing (e.g., the second housing 320 of FIG. 6) and transmit a force corresponding to rotation of the second housing 320 to the second connection unit 520. Alternatively, the second main gear 522 may receive a force from the first main gear 512 directly or via the auxiliary gear 532. As an example, the second connection unit 520 may transmit the force corresponding to the rotation of the second housing 320 to the first main gear 512 directly or via the auxiliary gear 532.

According to various embodiments, the driver 540 may include a driving shaft 541, a reception gear 542 disposed on a first side (+X-axis direction or a direction adjacent to the transmission gear 513) of the driving shaft 541, and a driving gear 543 disposed on a second side (−X-axis direction or a direction opposite to the first side) of the driving shaft 541. In an embodiment, the driver 540 may be connected to one or both of first and second cover plates 504-1 and 504-2. For example, the reception gear 542 may receive a force from the transmission gear 513, and correspondingly, the driving gear 543 connected to the cover plate 504-1, 504-2 may rotate to move the cover plate 504-1, 504-2. For example, the driving gear 543 may be provided as a pinion gear.

According to various embodiments, the cover plate 504-1, 504-2 may include a cover gear 505-1, 505-2. For example, the cover gear 505-1, 505-2 may be formed to be provided as a rack gear on an inner surface of the cover plate 504-1, 504-2. The cover plate 504-1, 504-2 of FIGS. 7 to 9 may have a same configuration in whole or in part as the support portion 402a-1, 402a-2 of FIG. 6.

In an embodiment, as shown in FIG. 9, the cover gear 505-1, 505-2 may be formed in at least a partial area of the cover plate 504-1, 504-2. For example, the cover gear 505-1, 505-2 may be formed in a partial area of the cover plate 504-1, 504-2 corresponding to a hinge opening 501a, 501b. The cover plate 504-1, 504-2 may include the first cover plate 504-1 and/or the second cover plate 504-2. The first cover plate 504-1 may include a first cover gear 505-1, and the second cover plate 504-2 may include a second cover gear 505-2. For example, the first cover plate 504-1 may include a first rack gear area 505a for meshing with the driving gear 543. For example, the first rack gear area 505a may include an area in which the first cover gear 505-1 is formed. For example, the second cover plate 504-2 may include a second rack gear area 505b for meshing with the driving gear 543. For example, the second rack gear area 505b may include an area in which the second cover gear 505-2 is formed. In an embodiment, the first cover plate 504-1 and the second cover plate 504-2 may be disposed on opposing sides (+Y-axis direction and −Y-axis direction) of the driving gear 543, respectively. For example, when the driving gear 543 rotates in a clockwise direction, the first cover plate 504-1 may move upward (in the +Z-axis direction) in response to operations of the first cover gear 505-1 and the driving gear 543, and a first hinge opening 501a may be opened. As an example, the second cover plate 504-2 may move downward (in the −Z-axis direction) in response to operations of the second cover gear 505-2 and the driving gear 543, and a second hinge opening 501b may be opened.

In one embodiment, while the transmission gear 513 is shown as formed in the first connection unit 510 in the drawing, this is only exemplary. In various embodiments, the transmission gear 513 may be formed in the second connection unit 520, or in both of the first connection unit 510 and the second connection unit 520.

In an embodiment, the force structure 500 may include a separate container 502 and various components may be accommodated within the container 502. However, this is not essential. For example, the container 502 may be the same as the first hinge housing 402a described before with reference to FIG. 6.

Referring to FIG. 9, the operation process of the force structure 500 according to various embodiments will be described.

In an embodiment (referring to FIGS. 8A and 8B and a cross-section D-D' of FIG. 9), when the second connection member 529 rotates in a counterclockwise direction (hereinafter, referred to as a "first direction"), the second main gear 522 may rotate in the first direction. In response to the rotation of the second main gear 522, each of a first auxiliary gear 531a and a second auxiliary gear 531b may rotate in the clockwise direction (hereinafter referred to as a "second direction") or in the first direction. Accordingly, the first main gear 512 may rotate in the second direction by receiving a force of the auxiliary gear 532.

Referring to FIGS. 8A and 8B and a cross-section E-E' of FIG. 9, the transmission gear 513 connected to the first main gear 512 through the first connection shaft 511 may rotate in the second direction in correspondence with the first main gear 512. Further, the reception gear 542 meshed with the transmission gear 513 may rotate in the first direction.

In addition, referring to FIGS. 8A and 8B and a cross-section F-F' of FIG. 9, the driving gear 543 connected to the reception gear 542 through the driving shaft 541 may rotate in the first direction in correspondence with the reception gear 542. The first cover gear 505-1 meshed with the driving gear 543 may be moved upward (in the +Z-axis direction), and the second cover gear 505-2 may be moved downward (in the −Z-axis direction).

In addition, referring to FIGS. 8A and 8B and a cross-section G-G' of FIG. 9, the first hinge opening 501a and/or the second hinge opening 501b may be opened in correspondence with the operation of the first cover gear 505-1 and/or the second cover gear 505-2.

Now, an embodiment of a hinge module 800 will be described in detail with reference to FIGS. 10A to 12.

Figure 10A:
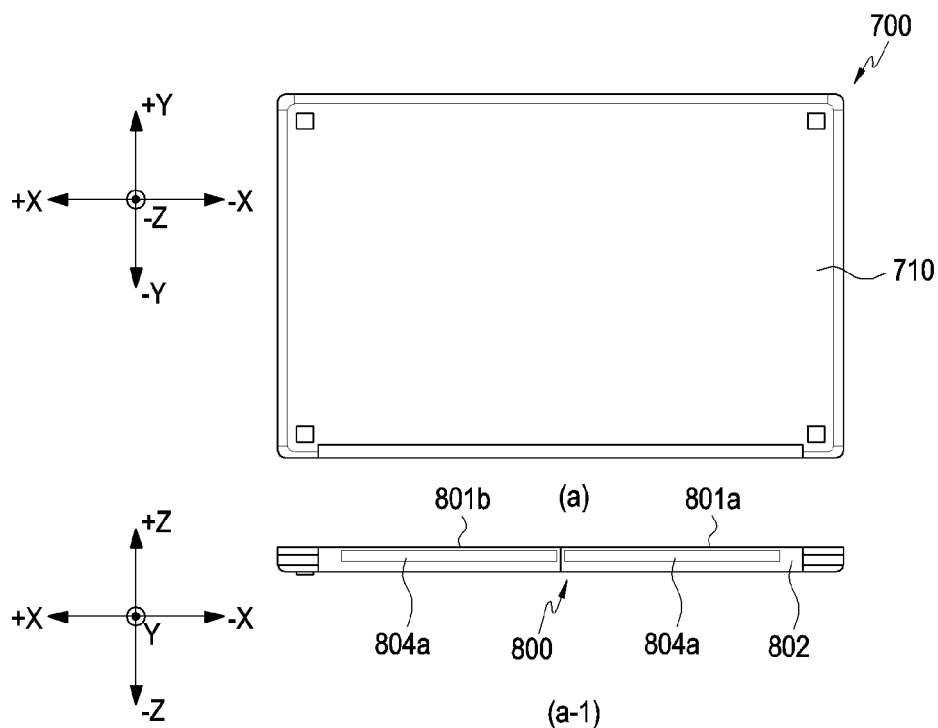
FIGS. 10A and 10B are diagrams illustrating a vent structure according to an embodiment.
Figure 10B:
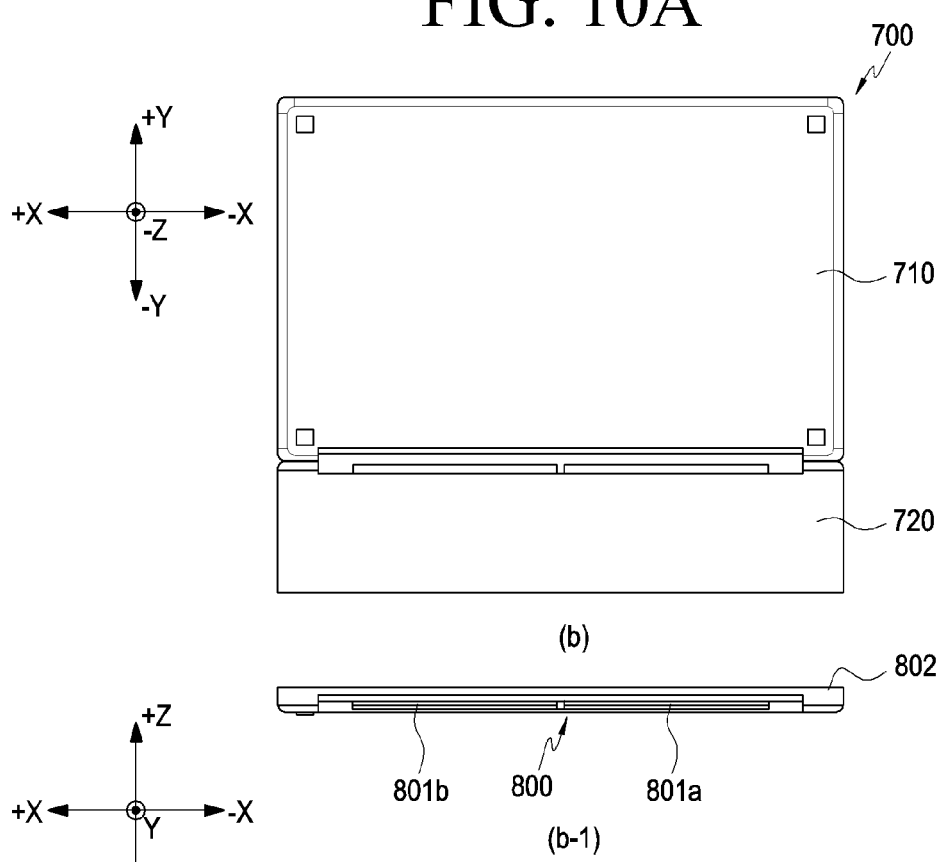
Figure 11A:
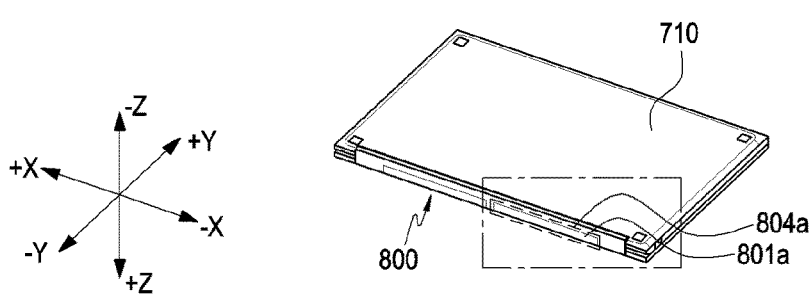
FIGS. 11A and 11B are diagram illustrating operations of an electronic device and a hinge module of FIGS. 10A and 10B.
Figure 11B:
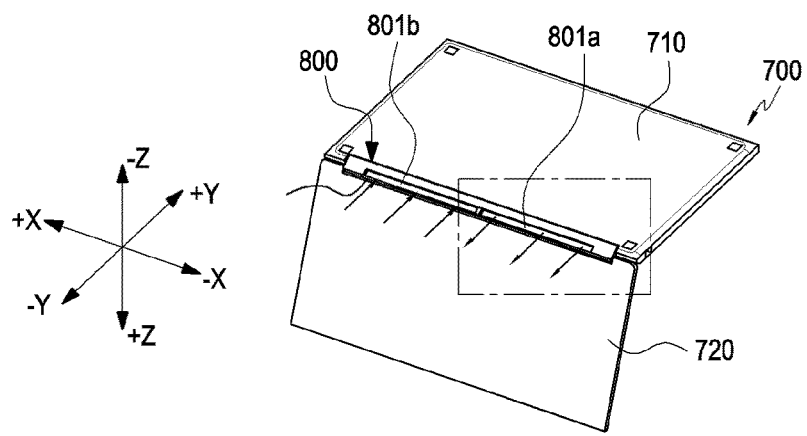
Figure 11C:
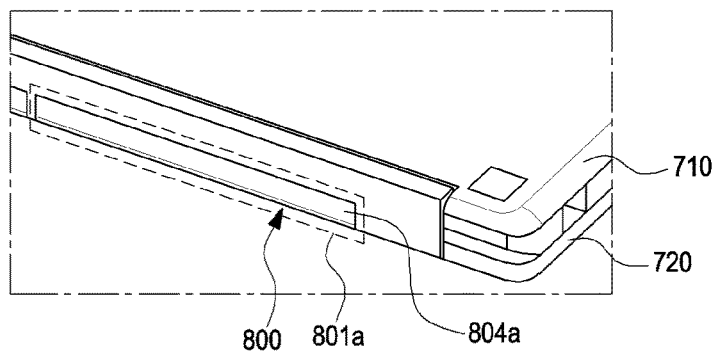
FIGS. 11C and 11D are enlarged views of the encircled portions of FIGS. 11A and 11B, respectively.
Figure 11D:
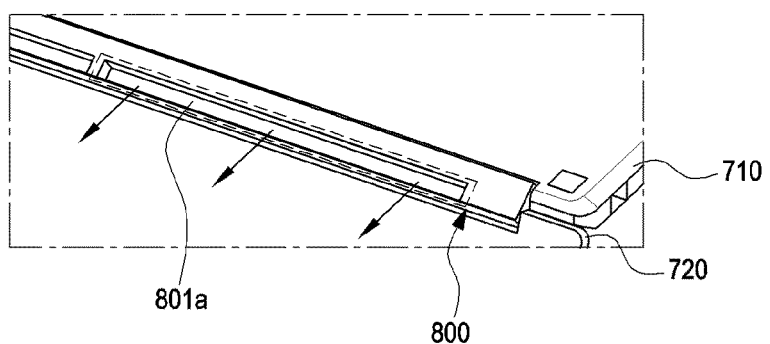
Figure 12:
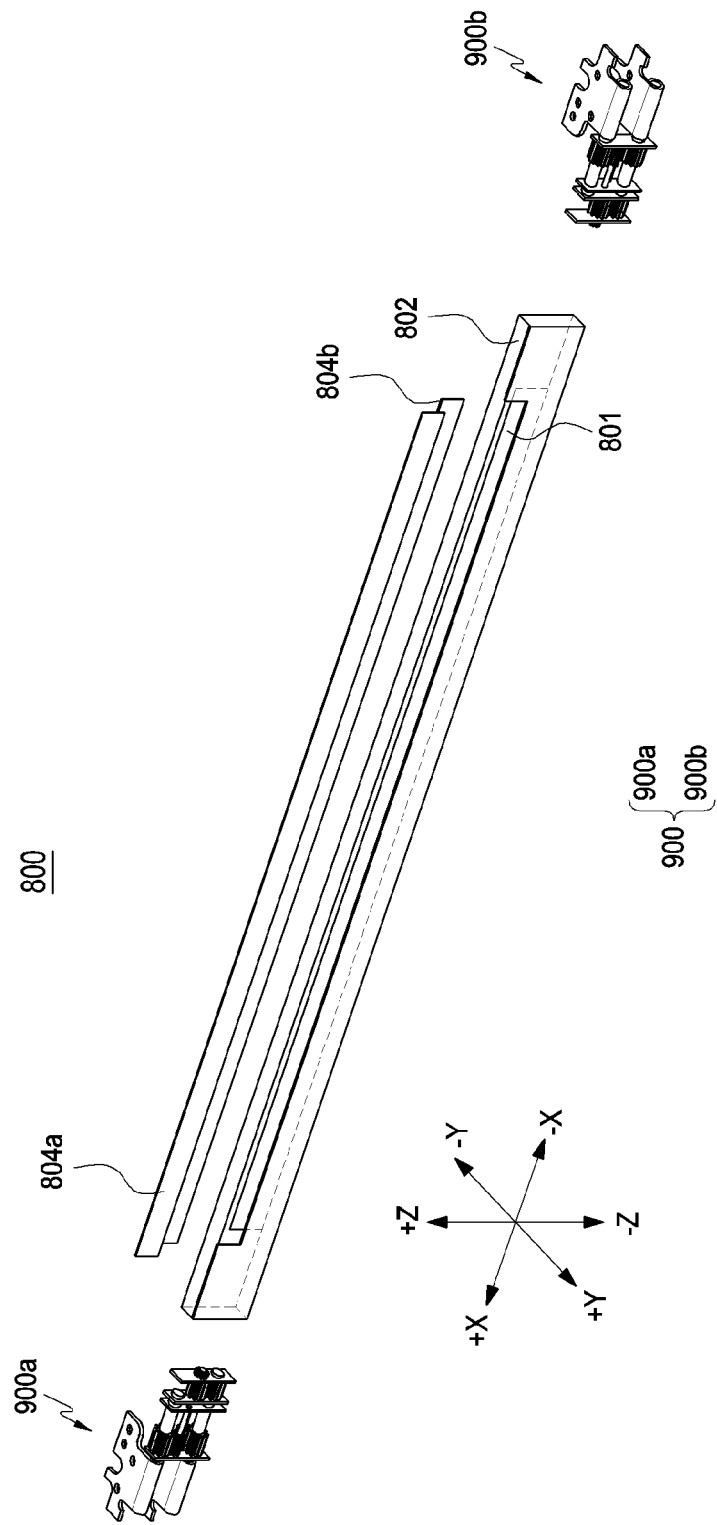
FIG. 12 is a diagram illustrating a force structure according to the second embodiment.

FIGS. 10A and 10B are diagrams illustrating a hinge module according to an embodiment. FIGS. 11A and 11B are diagrams illustrating operations of an electronic device and the hinge module of FIGS. 10A and 10B. FIGS. 11C and 11D are enlarged views of the encircled portions of FIGS. 11A and 11B, respectively. FIG. 12 is a diagram illustrating a force structure according to an embodiment.

Referring to FIGS. 10A to 12, an embodiment of an electronic device 700 may include the hinge module 800. The hinge module 800 may include a first vent hole 801a and a second vent hole 801b formed in a hinge housing 802. Alternatively, a single vent hole 801 may be formed in the hinge housing 802 (see FIG. 12). The features of the hinge module 400 described above may be adaptively applied in whole or part to the embodiment of the hinge module 800 shown in FIGS. 10A to 12.

According to various embodiments, the hinge module 800 may be integrally formed, unlike the above-described hinge module 400. For example, a single hinge module 800 may be formed and a plurality of vent holes (e.g., a first vent hole 801a and a second vent hole 801b) may be defined or formed in the single hinge housing 802. As described above, cover plates 804a and 804b included in the hinge module 800 may shield the vent holes 801a and 801b in a first state of the hinge module 800 (e.g., a state in which a first housing 710 and a second housing 720 are closed), and open the vent holes 801a and 801b in a second state of the hinge module 800 (e.g., a state in which the first housing 710 and the second housing 720 are open). The features of the cover plates 804a and 804b of FIGS. 10A to 12 may be the same in whole or part as those of the first cover plate 504-1 and the second cover plate 504-2 described above.

According to various embodiments, the hinge module 800 may include a force structure 900. The force structure 900 may include a first force structure 900a and a second force structure 900b. In an embodiment, the first force structure 900a and the second force structure 900b may be disposed on opposing sides of the hinge module 800, respectively. In an embodiment, the first force structure 900a and/or the second force structure 900b may be connected to the first cover plate 804a and/or the second cover plate 804b. For the operation of the force structure 900, the description of the force structure 500 in the above-described embodiment may be applied adaptively, and thus a redundant description will be avoided.

According to various embodiments of the disclosure, an electronic device may include: a first housing (e.g., the first housing 310 of FIG. 5) in which a display module is disposed; a second housing (e.g., the second housing 320 of FIG. 5) in which a circuit board and a cooling fan connected to the circuit board are accommodated, where a first opening (e.g., the first opening 312 of FIG. 6) is defined in the second housing to introduce air into the cooling fan; and a hinge module (e.g., the hinge module 400 of FIG. 5) rotatably connecting to the first housing and the second housing to each other, and disposed adjacent to the first opening. The hinge module may include: a hinge housing in which a first hinge opening (e.g., the first hinge opening 401*a*-1) is defined, wherein the first hinge opening is connected to the first opening; a first main gear (e.g., the first main gear 512 of FIG. 7) disposed in the hinge housing and operably connected to the first housing; a second main gear (e.g., the second main gear 522 of FIG. 7) operably connected to the second housing and rotatable in correspondence with the first main gear; a driving gear (e.g., the driving gear 543 of FIG. 9) disposed adjacent to at least one of the first main gear or the second main gear and rotatable in correspondence with at least one of the first main gear or the second main gear; and a first cover plate (e.g., the first cover plate 504-1 of FIG. 9) disposed in the hinge housing and including a first rack gear area (e.g., the first rack gear area 505*a* of FIG. 9) which meshes with the driving gear. The electronic device may be switchable between a closed state in which an angle formed by the first housing and the second housing is less than a predetermined angle and an open state in which the angle formed by the first housing and the second housing is equal to or greater than the predetermined angle. When the electronic device is in the closed state, the first cover plate may be disposed to overlap with at least part of the first hinge opening. When the electronic device is in the open state, the first cover plate may be spaced apart from the first hinge opening, and the first hinge opening may be opened.

According to an embodiment, the electronic device may further include a reception gear (e.g., the reception gear 542 of FIG. 9) disposed to have a same rotation axis as the driving gear, and the reception gear may be configured to transmit a force received from at least one of the first main gear or the second main gear to the driving gear.

According to an embodiment, the electronic device may further include a transmission gear (e.g., the transmission gear 513 of FIG. 9) disposed to have a same axis as the first main gear or the second main gear. The transmission gear may be disposed to mesh with the reception gear and configured to transmit the force from at least one of the first main gear or the second main gear to the reception gear.

According to an embodiment, the electronic device may further include an auxiliary gear (e.g., the auxiliary gear 532 of FIG. 7) disposed between the first main gear and the second main gear, to rotatably meshes with the first main gear and the second main gear.

According to an embodiment, the electronic device may further include a second cover plate (e.g., the second cover plate 504-2 of FIG. 9) including a second rack gear area (e.g., the second rack gear area 505*b* of FIG. 9) defined on at least part thereof, and a second hinge opening (e.g., the second hinge opening 401*a*-2 of FIG. 6) may be defined in the hinge housing.

According to an embodiment, in the closed state, the second cover plate may be disposed to overlap at least part of the second hinge opening, and in the open state, the second cover plate may be spaced apart from the first hinge opening.

According to an embodiment, the first rack gear area and the second rack gear area may be disposed on opposing sides of the driving gear, respectively, to face each other, and when the driving gear operates, the first cover plate and the second cover plate may move in different directions from each other.

According to an embodiment, the electronic device may further include a second hinge module (e.g., the second hinge module 400*b* of FIG. 4) spaced apart from the hinge module, and a second opening may be further defined in the second housing. The second hinge module may include: a second hinge housing in which a third hinge opening is defined to be connected to the second opening; a third main gear disposed in the second hinge housing and connected to the first housing; a fourth main gear connected to the second housing and rotatable in correspondence with the third main gear; a second driving gear disposed adjacent to at least one of the third main gear or the fourth main gear and rotatable in correspondence with at least one of the third main gear or the fourth main gear; and a third cover plate disposed in the hinge housing and including a third rack gear area which meshes with the driving gear.

According to an embodiment, in the open state, the first hinge opening may define an inlet to introduce air into the electronic device, and the third hinge opening may define an output to discharge air from the inside of the electronic device.

According to an embodiment, the electronic device may be at least one of a laptop computer or a tablet personal computer (PC).

According to an embodiment, the hinge module may further include a first connection member (e.g., the first connection member 519 of FIG. 7) connected to the first housing, and the first connection member may be disposed to have a same axis as the first main gear.

According to an embodiment, the hinge module may further include a second connection member (e.g., the second connection member 529 of FIG. 7) connected to the second housing, and the second connection member may be disposed to have a same axis as the second main gear.

According to various embodiments of the disclosure, a hinge module for rotatably connecting a first housing and a second housing to each other may include: a hinge housing (e.g., the hinge housing 402*a* of FIG. 6 including a first hinge opening (e.g., the first hinge opening 401*a*-1 of FIG. 6), to be connected to a first opening formed in the first housing or the second housing; a first connection unit (e.g., the first connection unit 510 of FIG. 7) including a first connection shaft, a first main gear connected to the first connection shaft, and a first connection member connected to the first connection shaft and the first housing; a second connection unit (e.g., the second connection unit 520 of FIG. 7) including a second connection shaft, a second main gear connected to the second connection shaft, a second connection member connected to the second connection shaft and the second housing, and a transmission gear connected to the second connection shaft and disposed adjacent to the second main gear; a driving gear (e.g., the driving gear 543 of FIG. 7) which operates by receiving a force received from the transmission gear; and a first cover plate (e.g., the first cover plate 504-1 of FIG. 9) including a first rack gear area which meshes with the driving gear. When at least one of the first housing or the second housing rotates, the cover plate may operate to be spaced from the first hinge opening.

According to an embodiment, the hinge module may further include a reception gear (e.g., the reception gear 542 of FIG. 8) disposed to have a same rotation axis as the driving gear, and the reception gear may mesh with the transmission gear and transmit a force from at least one selected from the first main gear and the second main gear to the driving gear.

According to an embodiment, the hinge module may further include an auxiliary gear (e.g., the auxiliary gear 530 of FIG. 8) disposed between the first main gear and the second main gear, where the auxiliary gear rotatably meshes with the first main gear and the second main gear.

According to an embodiment, the hinge module may further include a second cover plate (e.g., the second cover plate 504-2 of FIG. 9) including a second rack gear area, and a second hinge opening may be defined in the hinge housing.

According to an embodiment, the first rack gear area and the second rack gear area may be disposed on opposing sides of the driving gear, respectively, to face each other, and when the driving gear operates, the first cover plate and the second cover plate may move in different directions from each other.

According to an embodiment, the hinge module may be switchable between a first state in which the first hinge opening is shielded and a second state in which the first hinge opening is opened.

According to an embodiment, the first rack gear area may be defined in a partial area of the first cover plate corresponding to the first hinge opening.

According to an embodiment, a second hinge opening may be defined in the hinge housing to be disposed side by side with the first hinge opening.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. An electronic device comprising:
   a first housing in which a display module is disposed;
   a second housing in which a circuit board and a cooling fan connected to the circuit board are accommodated, wherein a first opening is defined in the second housing to introduce air into the cooling fan; and
   a hinge module rotatably connecting the first housing and the second housing to each other, and disposed adjacent to the first opening,
   wherein the hinge module comprises:
      a hinge housing in which a first hinge opening is defined to be connected to the first opening;
      a first main gear disposed in the hinge housing and operably connected to the first housing;
      a second main gear operably connected to the second housing and rotatable in correspondence with the first main gear;
      a driving gear disposed adjacent to at least one of the first main gear or the second main gear and rotatable in correspondence with at least one of the first main gear or the second main gear; and
      a first cover plate disposed in the hinge housing and including a first rack gear area which meshes with the driving gear,
   wherein the electronic device is switchable between a closed state in which an angle formed by the first housing and the second housing is less than a predetermined angle and an open state in which the angle formed by the first housing and the second housing is equal to or greater than the predetermined angle,
   wherein when the electronic device is in the closed state, the first cover plate is disposed to overlap at least part of the first hinge opening, and
   wherein when the electronic device is in the open state, the first cover plate is spaced apart from the first hinge opening, and the first hinge opening is opened.

2. The electronic device of claim 1, further comprising a reception gear disposed to have a same rotation axis as the driving gear,
   wherein the reception gear is configured to transmit a force received from at least one of the first main gear or the second main gear to the driving gear.

3. The electronic device of claim 2, further comprising a transmission gear disposed to have a same axis as the first main gear or the second main gear,
   wherein the transmission gear is disposed to mesh with the reception gear and configured to transmit the force from at least one of the first main gear or the second main gear to the reception gear.

4. The electronic device of claim 1, further comprising an auxiliary gear disposed between the first main gear and the second main gear, wherein the auxiliary gear rotatably meshes with the first main gear and the second main gear.

5. The electronic device of claim 1, further comprising a second cover plate including a second rack gear area,
   wherein a second hinge opening is defined in the hinge housing.

6. The electronic device of claim 5, wherein in the closed state, the second cover plate is disposed to overlap at least part of the second hinge opening, and
   wherein in the open state, the second cover plate is spaced apart from the second hinge opening.

7. The electronic device of claim 5, wherein the first rack gear area and the second rack gear area are disposed on opposing sides of the driving gear, respectively, to face each other, and when the driving gear operates, the first cover plate and the second cover plate move in different directions from each other.

8. The electronic device of claim 1, further comprising a second hinge module spaced apart from the hinge module,
   wherein the second housing further comprises a second opening, and
   wherein the second hinge module comprises:
      a second hinge housing in which a third hinge opening to be connected to the second opening;
      a third main gear disposed in the second hinge housing and connected to the first housing;
      a fourth main gear connected to the second housing and rotatable in correspondence with the third main gear;
      a second driving gear disposed adjacent to at least one of the third main gear or the fourth main gear and rotatable in correspondence with at least one of the third main gear or the fourth main gear; and
      a third cover plate disposed in the hinge housing and including a third rack gear area which meshes with the driving gear.

9. The electronic device of claim 8, wherein, in the open state, the first hinge opening defines an inlet to introduce air into the electronic device, and the third hinge opening defines an output to discharge air from the inside of the electronic device.

10. The electronic device of claim 1, wherein the electronic device is at least one of a laptop computer or a tablet personal computer.

11. The electronic device of claim 1, wherein the hinge module further comprises a first connection member connected to the first housing, and
wherein the first connection member is disposed to have a same axis as the first main gear.

12. The electronic device of claim 1, wherein the hinge module further comprises a second connection member connected to the second housing, and
wherein the second connection member is disposed to have a same axis as the second main gear.

13. A hinge module for rotatably connecting a first housing and a second housing to each other, the hinge module comprising:
a hinge housing in which a first hinge opening is defined to be connected to a first opening defined in the first housing or the second housing;
a first connection unit including a first connection shaft, a first main gear connected to the first connection shaft, and a first connection member connected to the first connection shaft and the first housing;
a second connection unit including a second connection shaft, a second main gear connected to the second connection shaft, a second connection member connected to the second connection shaft and the second housing, and a transmission gear connected to the second connection shaft and disposed adjacent to the second main gear;
a driving gear which operates by a force received from the transmission gear; and
a first cover plate including a first rack gear area which meshes with the driving gear,
wherein when at least one of the first housing or the second housing rotates, the first cover plate operates to be spaced from the first hinge opening.

14. The hinge module of claim 13, further comprising a reception gear disposed to have a same rotation axis as the driving gear,
wherein the reception gear is disposed to mesh with the transmission gear and configured to transmit a force from at least one of the first main gear or the second main gear to the driving gear.

15. The hinge module of claim 13, further comprising an auxiliary gear disposed between the first main gear and the second main gear, wherein the auxiliary gear rotatably meshes with the first main gear and the second main gear.

16. The hinge module of claim 13, further comprising a second cover plate including a second rack gear area,
wherein a second hinge opening is defined in the hinge housing.

17. The hinge module of claim 16, wherein the first rack gear area and the second rack gear area are disposed on opposing sides of the driving gear, respectively, to face each other, and when the driving gear operates, the first cover plate and the second cover plate move in different directions from each other.

18. The hinge module of claim 13, wherein the hinge module is switchable between a first state in which the first hinge opening is shielded and a second state in which the first hinge opening is opened.

19. The hinge module of claim 13, wherein the first rack gear area is defined in a partial area of the first cover plate corresponding to the first hinge opening.

20. The hinge module of claim 13, wherein a second hinge opening is defined in the hinge housing to be disposed side by side with the first hinge opening.

* * * * *